United States Patent [19]

Ando et al.

[11] Patent Number: 4,904,857

[45] Date of Patent: Feb. 27, 1990

[54] ELECTRIC CONTROL SYSTEM FOR PHOTOELECTRIC TOUCH INPUT APPARATUS

[75] Inventors: Noriyoshi Ando; Hajime Mikuni; Tomohisa Kishigami, all of Kariya, Japan

[73] Assignee: Nippondenso Co., Ltd., Kariya, Japan

[21] Appl. No.: 281,875

[22] Filed: Dec. 8, 1988

Related U.S. Application Data

[63] Continuation of Ser. No. 208,109, Jun. 19, 1988, abandoned, which is a continuation of Ser. No. 2,892, Jan. 13, 1987, abandoned.

[30] Foreign Application Priority Data

Jan. 13, 1986 [JP] Japan .................................. 61-4500

[51] Int. Cl.$^4$ ................................................ G01J 1/32
[52] U.S. Cl. .................................... 250/205; 250/221; 340/712
[58] Field of Search ..................... 250/205, 222.1, 221; 340/712; 341/31

[56] References Cited

U.S. PATENT DOCUMENTS

| | | | |
|---|---|---|---|
| 4,097,732 | 6/1978 | Krause et al. | 250/205 |
| 4,243,879 | 1/1981 | Carroll et al. | |
| 4,267,443 | 5/1981 | Carroll et al. | |
| 4,313,109 | 1/1982 | Funk et al. | 250/221 |
| 4,384,201 | 5/1983 | Carroll et al. | |
| 4,387,367 | 6/1983 | Fisher | 250/221 |
| 4,635,032 | 1/1987 | Virtanen | 250/205 |
| 4,636,632 | 1/1987 | Ando | |
| 4,684,801 | 8/1987 | Carroll et al. | 250/221 |
| 4,710,759 | 12/1987 | Fitzgibbon | 340/712 |

Primary Examiner—David C. Nelms
Attorney, Agent, or Firm—Cushman, Darby & Cushman

[57] ABSTRACT

An electric control system for a photoelectric touch input apparatus including a plurality of light-emitting elements arranged to produce a plurality of light beams in parallel on a common plane and a plurality of photosensitive elements opposed to and aligned with the light-emitting elements to receive the light beams so as to produce a plurality of light-receiving signals at each level of the light beams applied thereto. The control system is arranged to produce a plurality of drive signals respectively representative of a control valve for adjustment of each quantity of light of the light-emitting elements, to apply the drive signals to the light-emitting elements in sequence, to determine as to whether or not each level of the light-receiving signals is less than an optimum level, and if so, to adjust the control value in such a manner that each level of the light-receiving signals reaches the optimum level, and if not, to maintain the control value, to adjust each level of the drive signals in accordance with the control value, and to produce a switchover signal indicative of the position of an object such as an operator's finger when it interrupts one of the light beams. In this manner, relative differences in the quantity of light between the light-emitting elements and relative differences in the levels of the light-receiving signals may be compensated for, thereby maintaining the light-receiving signals of the photosensitive elements at an optimum level prior to use of the touch input apparatus.

6 Claims, 8 Drawing Sheets

ELECTRIC CONTROL SYSTEM FOR PHOTOELECTRIC TOUCH INPUT APPARATUS

This is a continuation of application Ser. No. 07/208,109, filed June 17, 1988, now abandoned, which is a continuation of application Ser. No. 07/002,892, filed Jan. 13, 1987, which was abandoned upon the filing hereof.

BACKGROUND OF THE INVENTION

1. Field of the Invention

The present invention relates to a photoelectric input apparatus for display systems, and more particularly to an electric control system for a photoelectric touch input apparatus adapted to be placed in front of the display surface of a display device such as a cathode ray tube, a liquid crystal display panel or the like.

2. Description of the Prior Art

In U.S. Pat. No. 4,243,879 issued on Jan. 6, 1981, there was proposed a photoelectric touch input apparatus which comprises a frame adapted to be placed in front of the display surface of a display device and defining an opening therein, a plurality of light-emitting elements mounted on the frame in a row along one side of the opening to produce a plurality of light beams in parallel spaced relationship on a common plane, and a plurality of photosensitive elements mounted on the frame in a row along the opposite side of the opening and aligned with the light-emitting elements to receive the light beams. In such a conventional photoelectric touch input apparatus, one of the light-receiving signals of the photosensitive elements drops in level when one of the light beams related thereto is interrupted by an operator's finger. As a result, a switchover signal is produced to switch over an indication or picture on the display surface to another indication or picture defined by the position of the operator's finger.

During use of this touch input apparatus, however, it has been found that there occur relative differences in quantity of light between the light-emitting elements due to relative differences in light-emitting characteristics of the light-emitting elements. Such a phenomenon is caused by change of the ambient temperature, use for a long period of time and the like. Similarly, relative differences between levels of the light-receiving signals are caused by relative differences in light-receiving characteristics of the photosensitive elements. For these reasons, it has been required to carefully select light-emitting elements and photosensitive elements having the same characteristics during a mounting process thereof. Furthermore, it has been required to position the light-emitting elements and photosensitive elements in place on the frame without causing any relative displacement.

SUMMARY OF THE INVENTION

It is, therefore, a primary object of the present invention to provide an electric control system for a photoelectric touch input apparatus capable of maintaining each level of the light-receiving signals of the photosensitive elements at an optimum level prior to use of the touch input apparatus.

According to the present invention, the primary object is accomplished by providing an electric control system for the touch input apparatus which comprises means for producing a plurality of drive signals respectively representative of a control value for adjustment of each quantity of light of the light-emitting elements, means for applying the drive signals to the light-emitting elements in sequence, means for determining as to whether or not each level of the light-receiving signals of the photosensitive elements is less than an optimum level, and if so adjusting the control value in such a manner that each level of the light-receiving signals reaches the optimum level, and if not, maintaining the control value, means for adjusting each level of the drive signals in accordance with the control value, means for producing a switchover signal indicative of the position of an object such as an operator's finger when it interrupts one of the light beams, and means responsive to the switchover signal to produce a control signal for switching over an indication or picture on the display surface of the display device to another indication or picture defined by the switchover signal.

Preferably, the means for producing a plurality of drive signals is arranged so as to intermittently produce each of the drive signals for a predetermined period of time to average the levels of the light-receiving signals of the photosensitive elements.

BRIEF DESCRIPTION OF THE DRAWINGS

Additional objects, features and advantages of the present invention will become more readily apparent from the following detailed description of a preferred embodiment thereof when considered with reference to the accompanying drawings, in which.

DESCRIPTION OF THE PREFERRED EMBODIMENT

Figure 1:
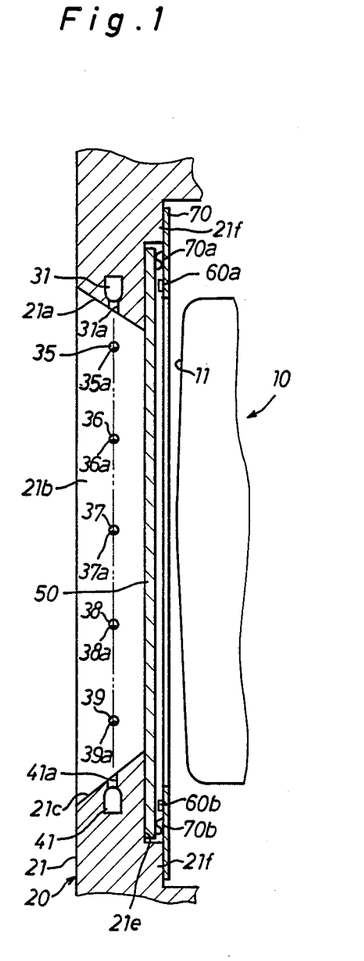
FIG. 1 is a sectional view of a photoelectric touch input apparatus.
Figure 2:
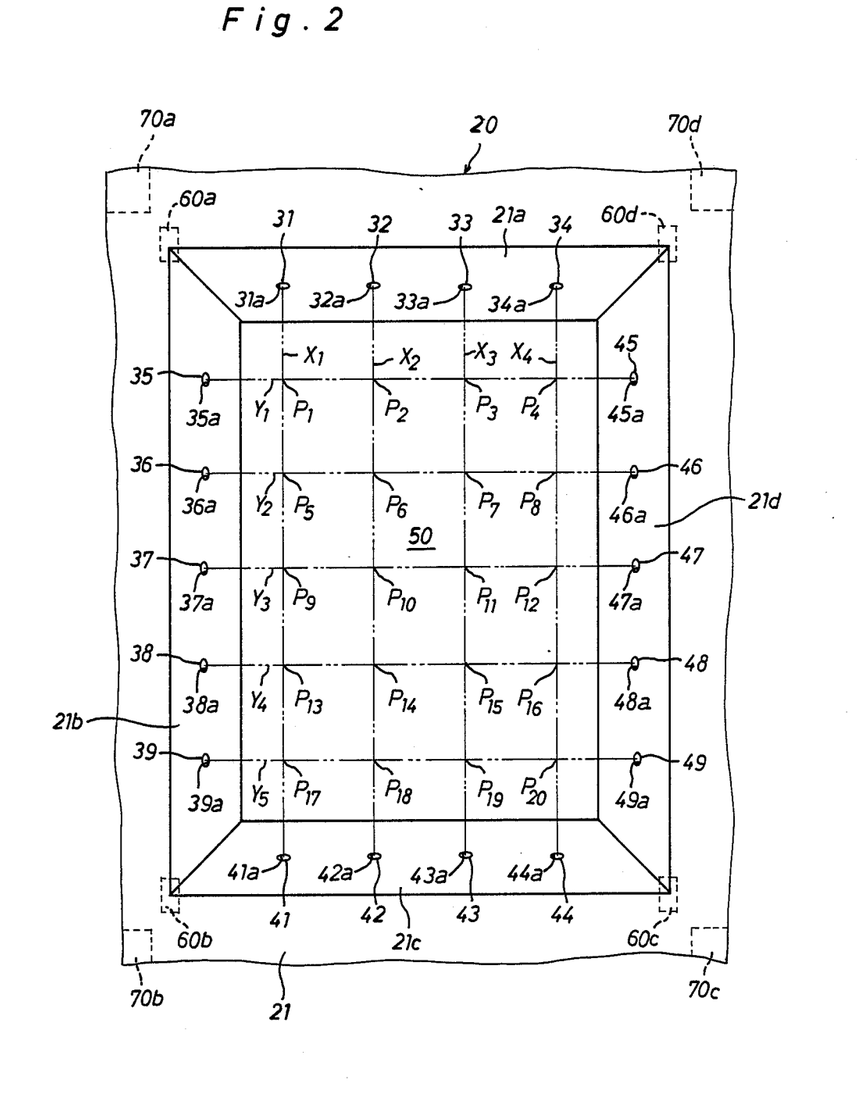
FIG. 2 is a front view of the photoelectric touch input apparatus shown in FIG. 1, illustrating a plurality of intersect points of light beams arranged in parallel spaced relationship on a common plane.

In FIGS. 1 and 2 of the drawings, there is illustrated a housing 20 for a photoelectric touch input apparatus in accordance with the present invention. The housing 20 has a rectangular front frame 21 which is adapted to be placed in parallel to a display surface 11 on the front of a display device 10 such as a cathode ray tube or a liquid crystal display panel. The front frame 21 has a central opening which is bounded by a pair of opposed side walls 21b and 21d and a pair of opposed upper and lower walls 21a and 21c. The upper wall 21a of front frame 21 is equipped with four light-emitting elements 31, 32, 33 and 34 such as light-emitting diodes which are laterally equi-spaced and mounted within the upper wall 21a in such a manner that a lens provided for each of the light-emitting elements 31–34 is faced toward the central opening of front frame 21 through respective holes 31a–34a. Thus, the light beams $X_1$, $X_2$, $X_3$ and $X_4$ of elements 31–34 are arranged in parallel to each other on a common plane within the central opening of front frame 21.

The left side wall 21b is equipped with five light-emitting elements 35, 36, 37, 38 and 39 such as light-emitting diodes which are vertically equi-spaced and mounted within the left side wall 21b in such a manner that a lens provided for each of the light-emitting elements 35–39 is faced toward the central opening of front frame 21 through respective holes 35a–39a. Thus, the light beams $Y_1$–$Y_5$ of elements 35–39 are arranged in parallel to each other and extend across the parallel spaced light beams $X_1$–$X_4$ of elements 31–34 on the common plane thereby to provide a plurality of intersect points $P_1$, $P_2$ ... $P_{19}$, $P_{20}$. In such an arrangement of the light beams, the intersect points $P_1$–$P_{20}$ are arranged to correspond with a plurality of different indications or pictures on the display surface 11 of display device 10.

The lower wall 21c of front frame 21 is equipped with four photosensitive elements 41, 42, 43 and 44 such as photodiodes or phototransistors which are laterally equi-spaced and mounted within the lower wall 21c in such a manner as to face toward the central opening of front frame 21 through respective holes 41a–44a. Thus, the photosensitive elements 41–44 are aligned with the light-emitting elements 31–34 to receive the light beams $X_1$–$X_4$ therefrom. The right side wall 21d of front frame 21 is equipped with five photosensitive elements 45, 46, 47, 48 and 49 such as photodiodes or phototransistors which are vertically equi-spaced and mounted within the right side wall 21d in such a manner as to face toward the central opening of front frame 21 through respective holes 45a–49a. Thus, the photosensitive elements 45–49 are aligned with the light-emitting elements 35–39 to receive the light beams $Y_1$–$Y_5$ therefrom.

As shown in FIG. 1, the front frame 21 is formed at the rear surface thereof with a rectangular frame-shaped recess 21e in which a rectangular filter plate 50 in the form of a transparent flat touch plate made of glass or hard synthetic resin is arranged to oppose the display surface 11 of display device 10 in parallel thereto. Arranged at each corner of the rear surface of filter plate 50 are four normally open microswitches 60a, 60b, 60c and 60d and four waved leaf springs 70a, 70b, 70c and 70d which are retained in place by engagement with a frame-shaped retainer plate 70 secured to the rear surface 21f of front frame 21. Thus, the filter plate 50 is resiliently supported on the front frame 21 to be moved by pressure of an operator's finger or stylus against the leaf springs 70a–70d toward the display surface 11 of display device 10. When the filter plate 50 is pushed by the operator's finger or stylus at a portion thereof, it is moved against at least one of the leaf springs 70a–70d toward the display surface 11 to close at least one of the microswitches 60a–60d. When released from pressure of the operator's finger or stylus, the filter plate 50 is moved apart from the display surface 11 by the compressed leaf spring to open the closed microswitch.

Figure 3:
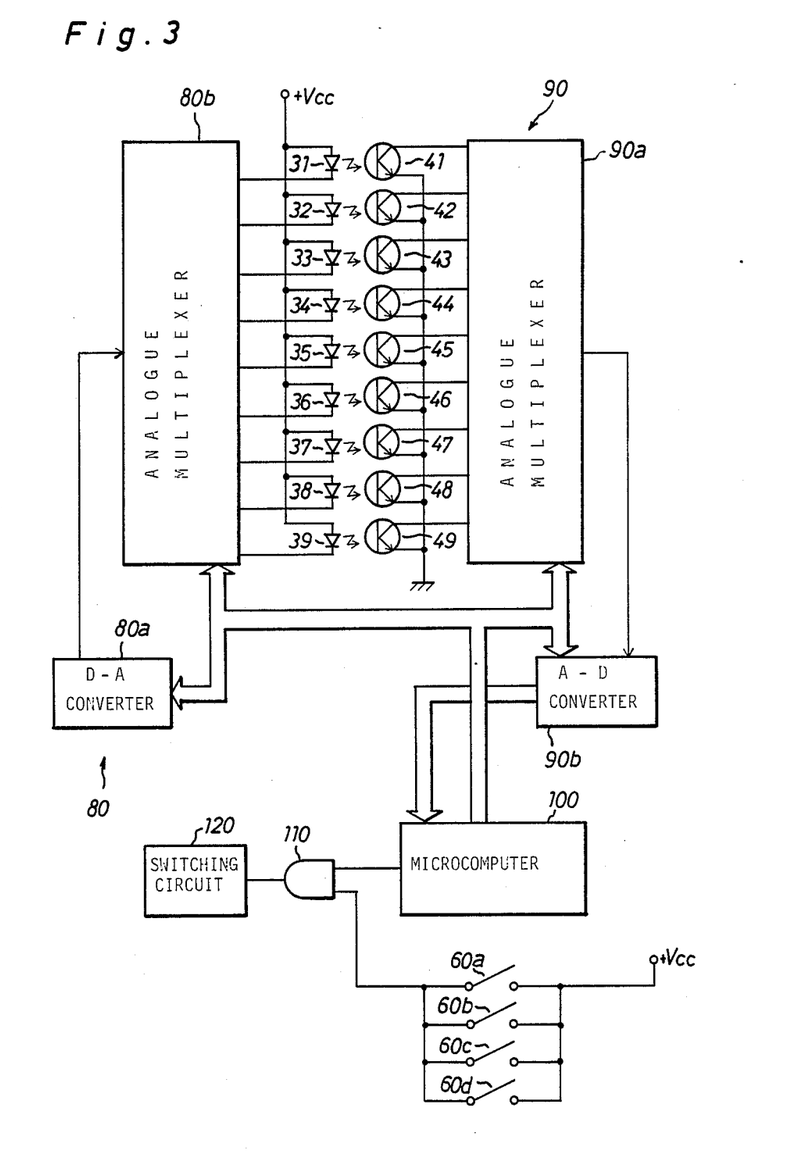
FIG. 3 is a block diagram of an electric control system for the touch input apparatus in accordance with the present invention.
Figure 4:
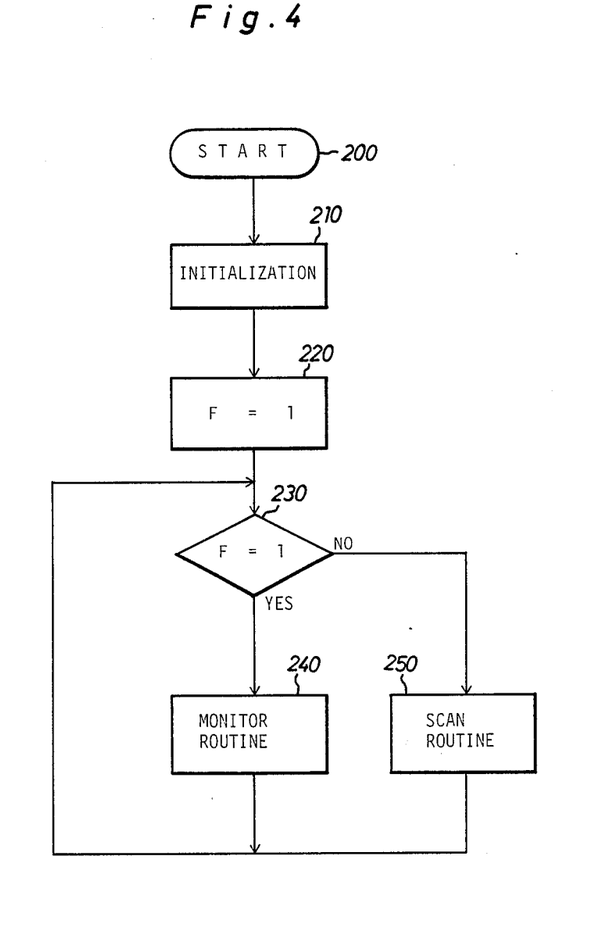
FIG. 4 is a flow chart illustrating a main routine of a computer control program.

As shown in FIG. 3, an electric control circuit for the photoelectric touch input apparatus comprises a driving circuit 80 connected to the light-emitting elements 31–39, a signal processing circuit 90 connected to the photosensitive elements 41–49, and a microcomputer 100 connected to the driving circuit 80 and signal processing circuit 90. The driving circuit 80 includes a digital to analogue or D-A converter 80a which is disposed between the computer 100 and an analogue multiplexer 80b. The D-A converter 80a is applied with a series of digital drive signals from computer 100 to convert them into a series of analogue drive signals. In this embodiment, a frequency of the digital drive signals from computer 100 is determined to be 7.5 KHz, and a frequency of the analogue drive signals from converter 80a is determined to be 7.5 KHz. Each value of the digital drive signals from computer 100 represents a digital value necessary for driving the respective light-emitting diodes 31–39. The analogue multiplexer 80b is arranged to apply the analogue drive signals from the D-A converter 80a to the light-emitting diodes 31–39 in response to a series of diode address signals applied thereto from the computer 100. When applied with the analogue drive signals from the D-A converter 80a through the analogue multiplexer 80b, the light-emitting diodes 31–39 are energized to produce the light beams $X_1$–$X_4$ and $Y_1$–$Y_5$ therefrom.

The signal processing circuit 90 includes an analogue multiplexer 90a connected to the phototransistors 41–49, and an analogue to digital or A-D converter 90b disposed between the analogue multiplexer 90a and computer 100. The analogue multiplexer 90a is arranged to apply a series of analogue light-receiving signals from the phototransistors 41–49 to the A-D converter 90b in response to a series of transistor address signals applied thereto from the computer 100. The A-D converter 90b is arranged to convert the analogue light-receiving signals into a series of digital light-receiving signals and apply them to the computer 100.

The computer 100 has a read-only memory or ROM which is arranged to preliminarily store a computer control program illustrated by flow charts in FIGS. 4 through 8. An AND gate 110 has input terminals connected to the computer 100 and microswitches 60a–60d. In this embodiment, the microswitches 60a–60d are connected in parallel to each other and connected to a DC voltage source +Vcc to produce a high level signal therefrom when closed by inward movement of the filter panel 50. When applied with a switchover signal from the computer 100 and at least one of the high level signals from microswitches 60a–60d, the AND gate 110 produces therefrom a high level signal indicative of the contents of the switchover signal. In this instance, the contents of the switchover signal are defined by one of the intersect points $P_1$–$P_{20}$ of the crossed light beams interrupted by the operator's finger. A switching circuit 120 is connected to the AND gate 110 to produce a control signal therefrom in response to the high level signal from AND gate 110. The control signal is applied to the display device 10 to switch over an indication or picture on the display surface 11 to another indication or picture defined by the interrupted intersect point.

In the case that the photoelectric touch input apparatus is adapted for use in automotive vehicles, the electric control circuit is connected to a DC voltage source in the form of a vehicle battery through a well-known ignition switch for a prime mover of the vehicle. Assuming that the ignition switch is closed to activate the electric control circuit, the computer 100 is activated to execute the control program illustrated in FIGS. 4 through 8 as follows. At step 200 shown in FIG. 4, the computer 100 starts to execute the control program and initializes the internal elements thereof at step 210 to clear data previously stored in its random access memory. At the following step 220, the computer 100 sets a flag F as "1" and causes the program to proceed to step 230 where the computer 100 determines a "Yes" answer because of F=1 and causes the program to proceed to a monitor routine 240 shown in FIGS. 5 and 6. At step 241 of the monitor routine, the computer 100 sets a number N as "1" and causes the program to proceed to step 242 where the computer 100 sets a first digital control value $V_1$ as "100000". In this embodiment, the number N is adapted to successively define the light-emitting diodes 31–39 and phototransistors 41–49 opposed thereto. It is, therefore, to be noted that the number "1" is adapted to define the first light-emitting diode 31 and phototransistor 41 opposed thereto.

Figure 5:
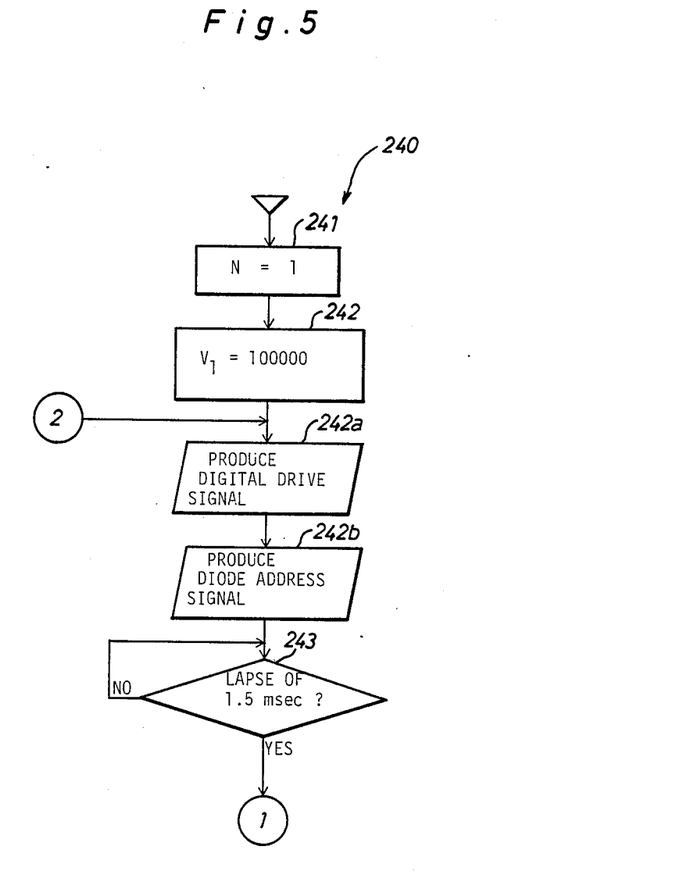
FIGS. 5 and 6 illustrate a flow chart of a monitor routine of the control program.
Figure 6:
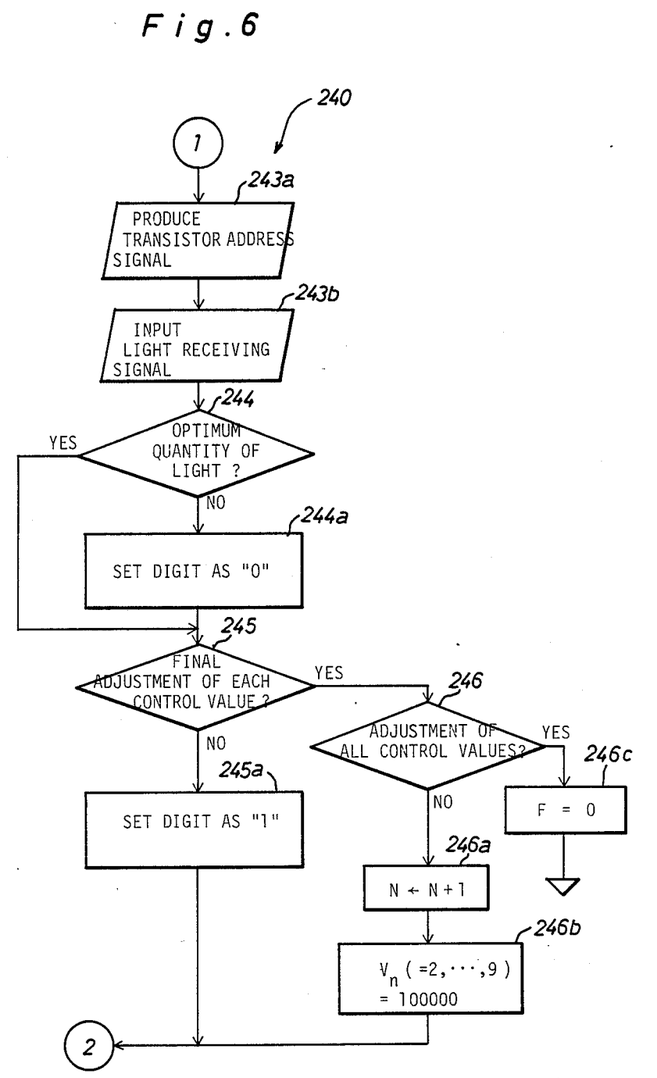

When the program proceeds to step 242a of the monitor routine, the computer 100 produces a series of first digital drive signals representative of the first digital control value $V_1$ and causes the program to proceed to step 242b where the computer 100 produces a first diode address signal therefrom. When applied with the first digital drive signals from the computer 100, the D-A converter 80a converts them into a series of first analogue drive signals, and in turn, the analogue multiplexer 80b applies the first analogue drive signals from the D-A converter to the light-emitting diode 31 in response to the first diode address signal. Thus, the light-emitting diode 31 is intermittently energized to generate light beams $X_1$ therefrom. In this instance, the quantity of light of diode 31 is determined by each level of the first analogue drive signals from analogue multiplexer 80b. When it receives the light beams from diode 31, the phototransistor 41 is intermittently energized to produce a series of first analogue light-receiving signals therefrom at each level of the light beams applied thereto. The intermittent energization of diode 31 is maintained for 1.5 msec after appearance of the first diode address signal at step 242b. This is effective to average the levels of the first analogue light-receiving signals from phototransistor 41.

After a lapse of 1.5 msec, the computer 100 determines a "Yes" answer at step 243 and causes the program to proceed to step 243a where the computer 100 produces a first transistor address signal therefrom. When applied with the first transistor address signal from the computer 100, the analogue multiplexer 90a applies the first analogue light-receiving signals from phototransistor 41 to the A-D converter 90b, and in turn, the A-D converter 90b acts to convert the first analogue light-receiving signals into a series of first digital light-receiving signals and apply them to the computer 100. When the program proceeds to step 243b, the computer 100 reads out the first digital light-receiving signals from the A-D converter 90b and causes the program to proceed to step 244. At this step 244, the computer 100 determines whether or not each level of the first digital light-receiving signals is less than a first optimum light-receiving value. In this embodiment, the first optimum light-receiving value is determined to maintain the light-receiving signals of phototransistor 41 at an optimum level and is preliminarily stored in the ROM of computer 100. Similarly, second to ninth optimum light-receiving values for the remaining phototransistors 42 to 49 are preliminarily stored in the ROM of computer 100. If the answer is "Yes" at step 244, the program proceeds to step 245 where the computer 100 determines a "No" answer. At the following step 245a, the computer 100 sets the fifth digit of the first digital control value $V_1$ as "1" and returns the program to step 242a.

Subsequently, the computer 100 produces a series of first digital drive signals indicative of the adjusted first digital control value $V_1$=110000 at step 242a and produces the first diode address signal therefrom at step 242b. When applied with the first digital drive signals from the computer 100, the D-A converter 80a converts them into a series of first analogue drive signals, and in turn, the analogue multiplexer 80b applies the first analogue drive signals from the D-A converter to the light-emitting diode 31 in response to the first diode address signal. Thus, the light-emitting diode 31 is intermittently energized to generate light beams $X_1$ therefrom. In this instance, the quantity of light of diode 31 increases in accordance with an increase of the adjusted first digital control value $V_1$ from 100000 to 110000, while each level of light-receiving signals from the phototransistor 41 rises in accordance with the increase of the light quantity of diode 31. If the computer 100 determines a "Yes" answer at step 244 after execution at steps 243–243b, the program will proceed to step 245. If the computer 100 determines a "No" answer at step 244, the program will proceed to step 244a where the computer 100 sets the fifth digit of the first digital control value $V_1$ as "0" and causes the program to proceed to step 245. At step 245, the computer 100 determines whether the monitor based on the first digital control value $V_1$ has been finished or not. If the answer is "No", the program will proceed to step 245a where the computer 100 sets the fourth digit of the first digital control value $V_1$ as "1" and returns the program to step 242a. As a result, if the answer is "No" at step 244, the control value $V_1$ will be adjusted to "101000" from "110000". If the answer is "Yes" at step 244, the control value $V_1$ will be adjusted to "111000" from "110000".

Subsequently, the computer 100 produces a series of first digital drive signals representative of the adjusted control value $V_1$=101000 or 111000 at step 242a and produces the first diode address signal therefrom at step 242b. Thus, the analogue multiplexer 80b cooperates with the D-A converter 80a and computer 100 to apply a series of first analogue drive signals to the light-emitting diode 31 at a level defined by the adjusted control value $V_1$. As a result, the quantity of light of diode 31 is increased or decreased in accordance with the adjusted control value $V_1$ to increase or decrease each level of the light-receiving signals of phototransistor 41. Thereafter, the computer 100 will repeat the foregoing execution at steps 244, 245, 245a, 242a, 242b, 243, 243a and 243b. After the lowest digit of the control value $V_1$ has been set as "1" at step 245a, the computer 100 determines a "Yes" answer or a "No" answer at step 244 and causes the program to directly proceed to step 245 or to proceed to step 245 through step 244a. This means that the monitor based on the first digital control value $V_1$ has been finished. Thus, the computer 100 determines a "Yes" answer at step 245 and causes the program to proceed to step 246.

During the foregoing execution of the control program, the first digital control value $V_1$ is adjusted at steps 244a and 245a in such a manner that each level of the first digital light-receiving signals is maintained above the first optimum light-receiving value prior to use of the touch input apparatus. This means that in spite of changes in light-emitting characteristics of diode 31 and/or in light-receiving characteristics of phototransistor 41, the first digital control value $V_1$ is adjusted to an optimum value to maintain each level of the first digital light-receiving signals above the first optimum light-receiving value.

Subsequently, the computer 100 determines a "No" answer at step 246 because of N=1 and causes the program to proceed to step 246a where the number N is set as "N+1=2". At the following step 246b, the computer 100 resets the first digital control value $V_1$ to a second digital control value $V_2=100000$ and causes the program to proceed to step 242a. Thereafter, the computer will repeat the foregoing execution at steps 242a–245a substantially in the same manner as described above so that the second digital control value $V_2$ is adjusted to maintain each level of the second digital light-receiving signals from phototransistor 42 above the second optimum light-receiving value. After the monitor based on the second digital control value $V_2$ has been finished, the computer 100 will repeat the foregoing execution at steps 242a–245a at each time when the execution passing through steps 245, 246, 246a and 246b is carried out. Thus, third to ninth digital control values $V_3-V_9$ will be successively adjusted in such a manner as to maintain each level of the digital light-receiving signals from the respective phototransistors 43–49 above the third to ninth optimum light-receiving values. This means that in spite of changes in light-emitting characteristics of diodes 33–39 and/or in light-receiving characteristics of phototransistors 43–49, the third to ninth digital control values $V_3-V_9$ are adjusted to an optimum value to maintain each level of the light-receiving signals from the respective phototransistors 43–49 above the third to ninth optimum light-receiving values.

From the above description, it will be understood that the first to ninth digital control values $V_1-V_9$ are respectively adjusted to the optimum value prior to each start of the touch input apparatus in operation. This is useful to maintain the control values $V_1-V_9$ at the respective optimum values in spite of relative difference in light-emitting characteristics of diodes 31–39 and in light-receiving characteristics of phototransistors 41–49 or an error in mounting of the diodes 31–39 and phototransistors 41–49 on the frame of housing 20.

When the computer 100 determines a "Yes" answer at step 246 after the foregoing execution, the program proceeds to step 246c where the computer 100 resets the flag F to "0" and causes the program to proceed to step 230 of the main routine. (see FIG. 4) When the computer 100 determines a "No" answer at step 230, the program proceeds to a scan routine 250 illustrated in FIGS. 7 and 8. At step 251 of the scan routine 250, the computer 100 sets the number N as "1" and causes the program to proceed to step 251a where the computer 100 selects the first optimum digital control value $V_1$ in relation to the number N=1. At the following step 251b, the computer 100 produces a series of first digital drive signals representative of the first optimum digital control value $V_1$ and causes the program to proceed to step 251c where the computer 100 produces the first diode address signal therefrom. When applied with the first digital drive signals from the computer 100, the D-A converter 80a converts them into a series of first analogue drive signals, and in turn, the analogue multiplexer 80b applies the first analogue drive signals from the D-A converter 80a to the light-emitting diode 31 in response to the first diode address signal. Thus, the light-emitting diode 31 is intermittently energized to generate light beams $X_1$ therefrom. In this instance, the quantity of light of diode 31 is maintained at an optimum level defined by the first optimum digital control value $V_1$.

Figure 7:
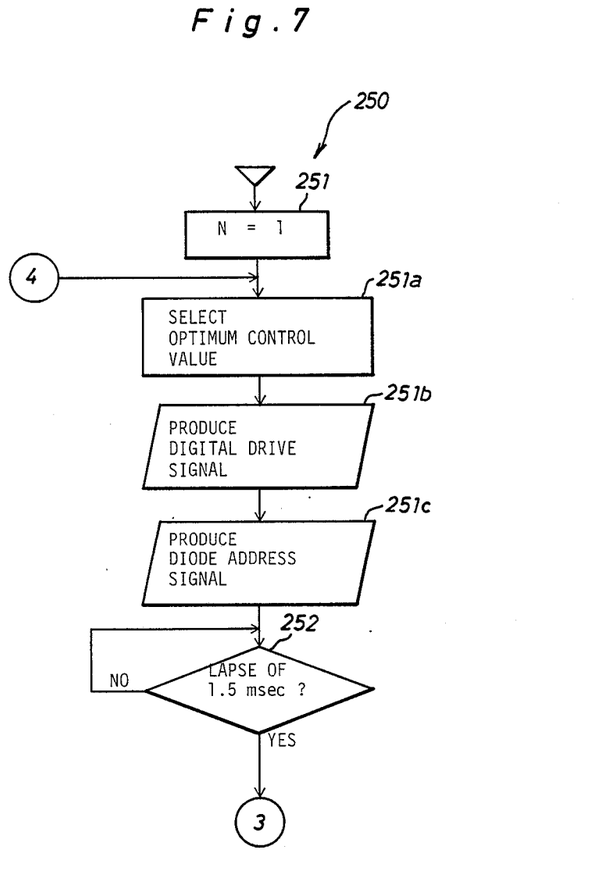
FIGS. 7 and 8 illustrate a scan routine of the control program.
Figure 8:
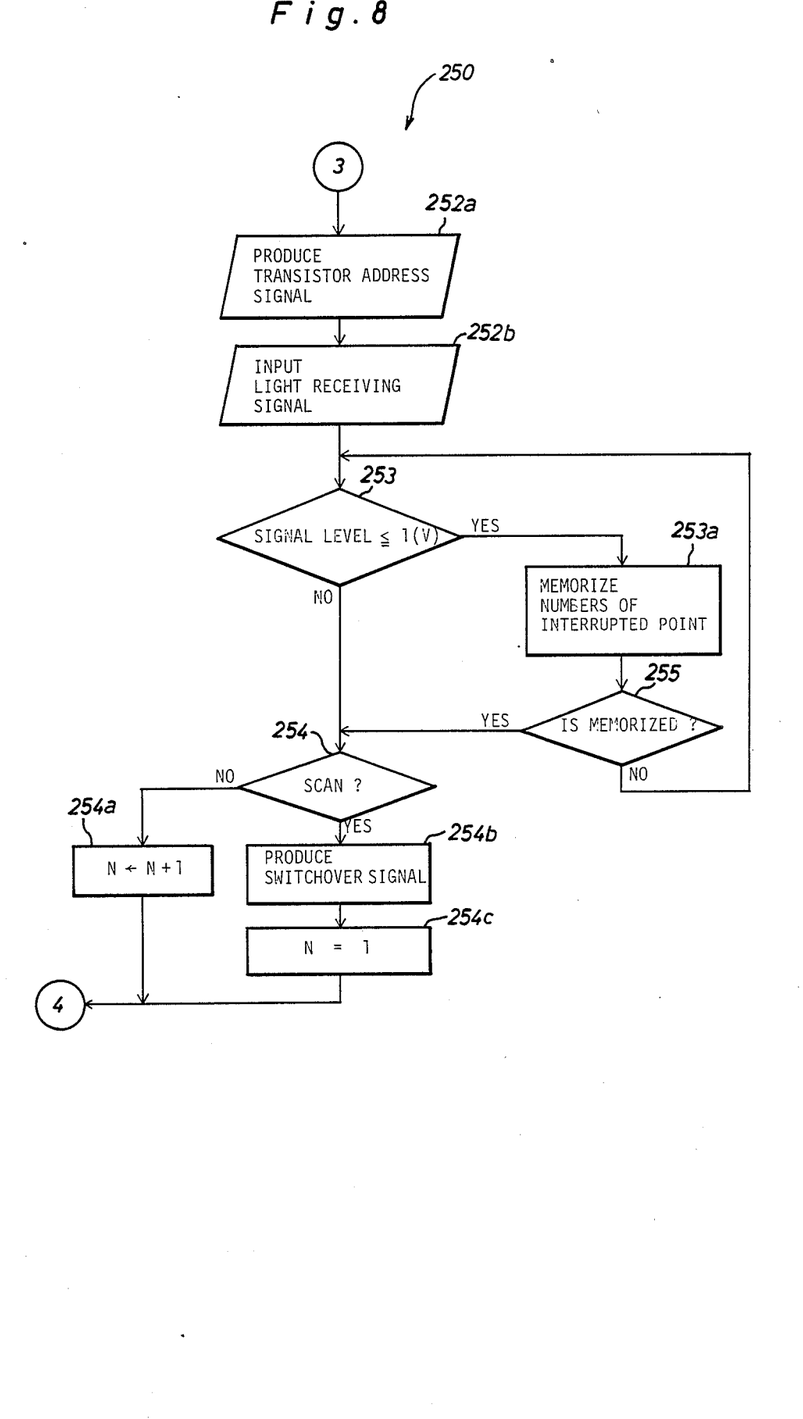

In response to the light beams $X_1$ from diode 31, the phototransistor 41 is intermittently energized to produce a series of first analogue light-receiving signals therefrom at each level of the light beams $X_1$ applied thereto. The intermittent energization of diode 31 is maintained for 1.5 msec after appearance of the first diode address signal at step 251c. This is effective to average the levels of the first analogue light-receiving signals from phototransistor 41. After a lapse of 1.5 msec, the computer 100 determines a "Yes" answer at step 252 and causes the program to proceed to step 252a where the computer 100 produces the first transistor address signal therefrom. When applied with the first transistor address signal, the analogue multiplexer 90a applies the first analogue light-receiving signals from phototransistor 41 to the A-D converter 90b, and in turn, the A-D converter 90b acts to convert the first analogue light-receiving signals into a series of first digital light-receiving signals and apply them to the computer 100. When the program proceeds to step 252b, the computer 100 is applied with the first digital light-receiving signals from the A-D converter 90b and causes the program to proceed to step 253. At this step 253, the computer 100 determines as to whether or not each level of the first digital light-receiving signals is less than or equal to a standard level 1(V). In this embodiment, the standard level 1(V) is determined to detect interruption of the light beams applied to the phototransistors from the light-emitting diodes and is preliminarily stored in the ROM of computer 100.

When the answer is "No" at step 253 because of non-interruption of the light beams from diode 31, the program proceeds to step 254a through step 254. At step 254a, the computer 100 resets the number N to N+1=2 and returns the program to step 251a. Subsequently, at step 251a, the computer 100 selects the second optimum control value $V_2$ in relation to the number N=2 and causes the program to proceed to step 251b where the computer 100 produces a series of second digital drive signals representative of the second optimum control value $V_2$. At the following step 251c, the computer 100 produces the second diode address signal therefrom and causes the program to proceed to step 252. Thus, the D-A converter 80a converts the second digital drive signals into a series of second analogue drive signals, and in turn, the analogue multiplexer 80b applies the second analogue drive signals to the light-emitting diode 32 in response to the second diode address signal. When applied with the second analogue drive signals, the light-emitting diode 32 is intermittently energized to generate light beams $X_2$ therefrom. In this instance, the quantity of light of diode 32 is maintained at an optimum level defined by the second optimum control value $V_2$. In response to the light beams $X_2$ from diode 32, the phototransistor 42 is intermittently energized to produce a series of second analogue light-receiving signals therefrom at each level of the light beams $X_2$ applied thereto. The intermittent energization of diode 32 is maintained for 1.5 msec after appearance of the second diode address signal. This is effective to average the levels of the second analogue light-receiving signals from phototransistor 42.

After a lapse of 1.5 msec, the computer 100 determines a "Yes" answer at step 252 and produces the second transistor address signal therefrom at step 252a. When applied with the second transistor address signal, the analogue multiplexer 90a applies the second analogue light-receiving signals to the A-D converter 90b, and in turn, the A-D converter 90b acts to convert the second analogue light-receiving signals into a series of second digital light-receiving signals and apply them to the computer 100. Thereafter, the computer 100 is applied with the second digital light-receiving signals at step 252b, determines a "No" answer at step 253 and causes the program to proceed to step 254a through step 254. Subsequently, the computer 100 will repeat the foregoing execution at steps 254a-254 in the same manner as described above. During repeat of the foregoing execution, the computer 100 will reset, in sequence, the number N to N=3, N=4, ... N=9 at step 254a, select the third to ninth optimum digital control values $V_3$-$V_9$ at step 251a, produce each series of third to ninth digital drive signals representative of the third to ninth optimum control values $V_3$-$V_9$ at step 251b and produce the third to ninth diode address signals at step 251c. Thus, the D-A converter 80a will convert, in sequence, the third to ninth digital drive signals into each series of third to ninth analogue drive signals, and in turn, the multiplexer 80b will apply, in sequence, the third to ninth analogue drive signals to the remaining light-emitting diodes 33-39. When applied with the third to ninth analogue drive signals, the light-emitting diodes 33-39 will be intermittently energized, in sequence, to produce light beams. In response to the light beams, the phototransistors 43-49 will be intermittently energized in sequence, to produce third to ninth analogue light-receiving signals at each optimum level defined by the third to ninth optimum control values $V_3$-$V_9$.

Assuming that during the foregoing execution of the scan routine 250, the filter plate 50 is pushed by the operator's finger at an intersect point $P_{10}$ to switch over an indication or picture on the display surface 11, a pair of crossed light beams $X_2$, $Y_3$ from the light-emitting diodes 32, 37 are simultaneously interrupted, and the filter plate 50 is moved inwards by pressure of the operator's finger against at least one of the leaf springs 70a-70d to close at least one of the microswitches 60a-60d. As a result, each level of the analogue light-receiving signals of phototransistors 42 and 47 drops below the standard level 1(V), and in turn, the computer 100 determines a "Yes" answer at step 253 and memorizes the numbers N=2 and N=7 at step 253a. Simultaneously, the closed microswitch produces a high level signal therefrom. Thereafter, the computer 100 determines a "Yes" answer respectively at steps 255 and 254 and causes the program to proceed to step 254b. At this step 254b, the computer 100 produces a switch-over signal indicative of the intersect point $P_{10}$ and causes the program to proceed to step 254c where the computer 100 resets the numbers 2 and 7 to N=1. Thus, the AND gate 110 produces a high level signal therefrom in response to the switchover signal from the computer 100 and the high level signal from the closed microswitch, and in turn, the switching circuit 120 is activated in response to the high level signal from the AND gate 110 to produce a control signal for switching over the indication or picture on the display surface 11 to another indication or picture defined by the intersect point $P_{10}$.

Even if in such operaton, another intersect point adjacent the point $P_{10}$ is erroneously interrupted by an inclined approach of the operator's finger, all the microswitches 60a-60d will be still maintained in their open positions unless the filter plate 50 is pushed by the operator's finger. As a result, the AND gate 90a does not produce any high level signal due to lack of the high level signal from the microswitches 60a-60d, and the switching circuit 120 is maintained in its deactivated condition. This is effective to avoid a false indication on the display surface 11 caused by the inclined approach of the operator's finger or stylus. Additionally, in such operation as described above, the filter plate 50 is useful to ensure clear visual recognition of a desired position on the display surface 11 of display device 10.

In addition, when the filter plate 50 is pushed by the operator's finger at another intersect point $P_1$, $P_2$, ... $P_9$, $P_{11}$, ... $P_{19}$ or $P_{20}$, the indication or picture on the display is switched over to another indication or picture defined by the pushed point substantially in the same manner as described above. In the actual practice of the present invention, the normally open microswitches 60a-60d may be replaced with a plurality of normally closed microswitches which are connected to the AND gate 110 through an inverter. Alternatively, the normally open microswitches 60a-60d may be replaced with a plurality of photocouplers which are cooperable with a projection formed on each corner of the filter plate 50.

Although in the above embodiment, the control program has been arranged to conduct the execution of the monitor routine 240 in depedence upon the flag F=1 prior to each start of the touch input apparatus in operation, the control program may be arranged to conduct the execution at step 244 of the monitor routine 240 between steps 254 and 254a of the scan routine 250 so as to carry out the execution of the monitor routine.

Having thus described the preferred embodiment of the invention, it should be understood that numerous modifications and adaptations may be resorted to without departing from the spirit of the invention.

What is claimed is:

1. A photoelectric touch input apparatus adapted to be placed in front of a display device, comprising:
   a housing having a frame adapted to be placed in front of a display surface of said display device, said frame defining an opening therein;
   a plurality of light-emitting elements mounted on said frame in a row along at least one side of said opening to produce a plurality of light beams in parallel spaced relationship on a common plane;
   a plurality of photosensitive elements mounted on said frame in a row along the opposite side of said opening from said plurality of light-emitting elements and aligned with said light-emitting elements to receive the light beams emitted therefrom, said photosensitive elements being arranged to produce a plurality of light-receiving signals in response to the light beams applied thereto from said light-emitting elements;
   first means for producing a plurality of drive signals respectively representative of a control value for adjustment of each quantity of light of said light-emitting elements, said first means including means for applying said drive signals to said light-emitting elements in sequence and means for adjusting said control value in such a manner that each level of said light-receiving signals reaches an optimum level, and for memorizing said adjusted control value;
   second means for adjusting each level of said drive signals in accordance with said memorized control value only after adjustment of said control value and for maintaining said drive signals at the adjusted level, said second means including means for determining whether or not an object such as an operator's finger interrupts one of the light beams, and if so, producing a switchover signal indicative of the position of the object; and means responsive to said switchover signal to produce a control signal for switching over an indication or picture on the display surface of said display device to another indication or picture defined by said switchover signal.

2. A photoelectric touch input apparatus as recited in claim 1, wherein said first means for producing a plurality of drive signals is arranged to intermittently produce each of said drive signals for a predetermined period of time.

3. A photoelectric touch input apparatus as recited in claim 1, wherein said first means for producing a plurality of drive signals is arranged to produce each of said drive signals representative of a control value in the form of a binary number for adjustment of each quantity of light of said light-emitting elements.

4. A photoelectric touch input apparatus as recited in claim 1, wherein said second means further includes means for permitting adjustment of each level of said drive signals only after adjustment of said control value.

5. A photoelectric touch input apparatus as recited in claim 4, wherein said display device is adapted for use with an automotive vehicle and said first means is activated upon actuation of an ignition switch of said automotive vehicle.

6. A photoelectric touch input apparatus adapted to be placed in front of a display device, comprising:
a housing having a frame adapted to be placed in front of a display surface of said display device, said frame defining an opening therein;
a plurality of light-emitting elements mounted on said frame in a row along at least one side of said opening to produce a plurality of light beams in parallel spaced relationship on a common plane;
a plurality of photosensitive elements mounted on said frame in a row along the opposite side of said opening from said plurality of light-emitting elements and aligned with said light-emitting elements to receive the light beams emitted therefrom, said photosensitive elements being arranged to produce a plurality of light-receiving signals in response to the light beams applied thereto from said light-emitting elements;
first means for producing a plurality of drive signals respectively representative of a control value for adjustment of each quantity of light of said light-emitting elements, said first means including means for applying said drive signals to said light-emitting elements in sequence and means for adjusting said control value in such a manner that each level of said light-receiving signals reaches an optimum level, and for memorizing said adjusted control value; and
second means for adjusting each level of said drive signals in accordance with said memorized control value only after adjustment of said control value and for maintaining said drive signals at the adjusted level, said second means including means for determining whether or not an object such as an operator's finger interrupts one of the light beams, and if so, producing a signal indicative of the position of the object.

* * * * *